United States Patent [19]

Urai

[11] Patent Number: 5,732,019
[45] Date of Patent: Mar. 24, 1998

[54] INITIALIZATION OF ELECTRICALLY ERASABLE NON-VOLATILE SEMICONDUCTOR MEMORY DEVICE

[75] Inventor: Takahiko Urai, Tokyo, Japan

[73] Assignee: NEC Corporation, Tokyo, Japan

[21] Appl. No.: 858,916

[22] Filed: May 19, 1997

Related U.S. Application Data

[63] Continuation of Ser. No. 531,897, Sep. 22, 1995, abandoned.

[30] Foreign Application Priority Data

Sep. 30, 1994 [JP] Japan ................... 6-236539

[51] Int. Cl.⁶ ................................................. G11C 29/00
[52] U.S. Cl. ........................... 365/185.24; 365/185.11; 365/185.29
[58] Field of Search ..................... 365/185.11, 185.29, 365/185.24

[56] References Cited

U.S. PATENT DOCUMENTS 5,297,096  3/1994  Terada ...................... 365/185.11

FOREIGN PATENT DOCUMENTS 3-130995  6/1991  Japan.

OTHER PUBLICATIONS

S. Yamada et al. "A Self-Convergence Erasing Scheme for a Simple Stacked Gate Flash EEPROM" IEDM Technical Digest, 1991, pp. 307–310.

K. Oyama et al."A Novel Erasing Technoloby for 3.3V Flash Memory With 64Mb Capacity and Beyond" IEDM Technical Digest, 1992, pp. 607–610.

Primary Examiner—David C. Nelms
Assistant Examiner—Michael T. Tran
Attorney, Agent, or Firm—Foley & Lardner

[57] ABSTRACT

In a method of initializing an electrically erasable non-volatile semiconductor memory device including a memory cell array composed of a plurality of blocks, an erasing operation to each of the memory cell blocks is first executed until a threshold voltage of each memory cell of the each memory block is equal to or lower than a first predetermined value which is lower than a second predetermined value as a final upper limit of a final distribution of threshold voltages of all the memory cells in the each memory block. Next, a programming back operation is executed to the each memory block until each memory cell has the threshold voltage equal to or higher than a third predetermined value as a final lower limit. Finally, a verifying operation is executed to the each memory block to ensure that all the memory cells of the each memory block have the threshold voltages lower than the upper limit.

20 Claims, 7 Drawing Sheets

PRIOR ART   PRIOR ART

INITIALIZATION OF ELECTRICALLY ERASABLE NON-VOLATILE SEMICONDUCTOR MEMORY DEVICE

This application is a continuation of application Ser. No. 08/531,897, filed Sep. 22, 1995 now abandoned.

BACKGROUND OF THE INVENTION

1. Field of the Invention

The present invention relates to initialization of an electrically erasable non-volatile semiconductor memory device, and more particularly, to initialization of an electrically erasable non-volatile semiconductor memory device by an over-erasing operation.

2. Description of Related Art

Recently, there is a possibility that a new application field of a semiconductor memory device may be developed as the capacity of the semiconductor memory devices has become greater. One of such semiconductor memory devices is an electrically erasable non-volatile semiconductor memory device, and specifically a flash memory is spotlighted.

Since the flash memory can store data without battery back-up and can be readily produced to have the capacity as much as of a DRAM, a large market is expected in future. In the flash memory, however, there are some problems to be solved. For instance, the problems are long erase and programming times, necessitation of provision of two power sources, and difficulty of low voltage operation compared to other devices, etc. There is also another problem that a threshold voltage of a memory cell in erasure must be controlled such that it is lower than the voltage of a word line on selection and it is not too low so as not to generate leak current. That is, the distribution of memory cell threshold voltages needs to be confined in a predetermined range. Specifically, in order to realize a low voltage operation, it is very important to confine the distribution of threshold voltages in a narrow range.

With the narrowing of the distribution of threshold voltages of the memory cells upon an erasing operation of the flash memory, which is the most important element for increase of the product yield of the flash memory, there are proposed and tried various methods heretofore. Since the distribution of threshold voltages is due to the manufacturing process such as the film thickness and film property of a transistor, and the impurity profile of a semiconductor substrate, the many methods of producing the memory cells have essentially small deviation by improving the manufacturing process. However, in these methods, if the optimal condition of the manufacturing process is not satisfied, the effect of improvement cannot be accomplished so that the instability of operation will be remained. That is, in the method of improving the manufacturing process, if the condition for the method is not satisfied, the effect rapidly reduces. The method is not a fundamental method in which the distribution of threshold voltages can be confined in a predetermined range in any case. Since the conventional erasing operation must be used, if the condition is not satisfied, a product would be determined as a defective flash memory. Thus, the product yield would be decreased.

FIG. 1 is a flow chart illustrating the conventional erasing method of a flash memory. Referring to FIG. 1, a pre-programming operation is first executed while a verifying operation is executed (step 201). More particularly, in the pre-programming operation, an address counter AXY and a counter PPC are set to "0" in step 212 and 214. The pre-programming operation is executed for one byte in a step 216. Next, the counter PPC is incremented by "1" in a step 218. In a step 220, whether the threshold voltage is equal to or higher than a final target voltage $V_{PV}$ is checked. If not, the pre-programming operation is repeated in the step 216 through a step 222. When it is determined in the step 222 that the counter PPC is over a predetermined value $C_P$, the memory device is determined to be defective. If the verifying operation is passed in the step 220, whether the address counter AXY indicates the final memory cell address is checked in a step 224. If not, the address counter AXY is incremented by "1", the step 214 is executed to perform the pre-programming operation to the next memory cell in the step 216. If the final memory cell address in the step 224, the pre-programming operation is completed. As a result, the distribution of threshold voltages after the pre-programming operation is obtained as shown in FIG. 2A.

Next, an erasing operation is executed (step 202). More particularly, an address counter AXY and counter EPC are set to "0" in steps 232 and 234. In a step 236, an erasing operation is executed in the memory block while an erase verifying operation is executed. At this time, the erasing operation is executed by applying pulses having a relatively short duration to a memory cell designated by the address counter AXY in steps 238 to 242 to reduce the upper limit of the distribution of threshold voltages of the memory cells to a voltage lower than a final target voltage of $V_{EV}$, for example, 3V. In this case, if it is determined in the step 242 that the number of cycles is over a predetermined value $C_E$, the device is determined to be defective. Also, if it is determined in the step 240 that the threshold voltage is equal to or lower than the voltage $V_{EV}$, whether the address counter AXY indicates a final memory cell address is determined in a step 244. If not the final memory cell address, the address counter AXY is incremented by "1" to execute the verifying operation to the next memory cell. If the final memory cell address, the erasing operation is completed. The distribution of threshold voltages after the erasing operation is shown in FIG. 2B.

Finally, a threshold voltage lower limit checking operation is executed in a step 203. In the checking step, an address counter AY is set to "0" in a step 252. In a step 254, a verifying operation is executed to ensure that the threshold voltage of each memory cell is equal to or higher than a final target value of $V_{DV}$, for example, 0.5V. If not in the step 254, the memory device is determined to be defective. When the step 254 is passed, whether the address counter AY indicates the final memory address is checked in a step 256. If not, a step 258 is executed to increment the address counter AY by "1" and then the verifying operation is executed to the next memory cell. If yes in the step 256, the initializing operation is completed. At this time, the lower limit of the distribution of threshold voltages is ensured.

If the lower limit is lower than the predetermined voltage $V_{DV}$, since leak current flows in a memory cell even in a non-selection state, there is the possibility that inconvenient phenomena occur in which data of all the memory cells connected to a bit line is connected are determined as "1" (ON) in a read operation, or a programming operation cannot be executed in the memory cells connected to the bit line because of the leak current. Since this checking operation is concerned with a problem caused in units of bit lines as described above, the checking operation is executed in units of bit lines (it is not necessary to execute the checking operation in units of memory cells).

Recently, there have been proposed approaches to narrow the distribution of threshold voltages after the erasure systematically or by adding an internal operation.

A first one of such approaches is disclosed by S. Yamada, et al. in "A SELF-CONVERGENCE ERASING SCHEME FOR A SIMPLE STACKED GATE FLASH EEPROM" (IEDM Technical Digest, (1991), pp. 307–310). In this approach, two steps are executed for initialization. First, a negative voltage is applied to the control gate, a positive voltage (5V) is applied to the source of the memory cell transistor, and the drain is grounded. As a result, a discharging operation is executed by use of Fowler-Nordheim (F-N) tunneling. Then, the positive potential and the ground potential are applied to the source and the drain, respectively, and the control gate is grounded. At this time, avalanche hot carriers induced by channel hot electrons are injected. As a result, threshold voltages are converged into a constant value.

The second conventional one of the approaches is disclosed by K. Oyama et al. in "A Novel Erasing Technology for 3.3V Flash Memory with 64 Mb Capacity and Beyond" (IEDM Technical Digest, 1992, pp. 607–610). In this approach, the distribution of threshold voltages is narrowed by applying a positive high voltage to a control gate, based on the fact that the deviation of barrier heights when electrons are moved from a substrate to a floating gate is smaller than that of barrier height when electrons are moved from the floating gate to the substrate in the F-N tunneling.

Further, there is another approach disclosed in Japanese Laid Open Patent Disclosure (JP-A-Heisei3-130995) as the third conventional approach. In the approach, after an erasing operation is executed, a programming-back operation is executed with a small electric field having a direction opposite to that of the electric field used in the erasing operation.

There are problems in the above-mentioned conventional erasing operations of the non-volatile semiconductor memory. If no measurements are taken as shown in FIG. 1, the deviation of threshold voltages must be considered to some extent as the condition of a manufacturing process changes. Therefore, there are problems in decrease of the product yield and the difficulty of measurements of low voltage read operation.

In the initializing method shown in FIG. 1, the pre-programming operation 201 is essential for narrowing the distribution of threshold voltages to some extent. Therefore, the pre-programming operation 201 cannot be omitted. There is a problem in long erasing operation time.

In the systematic measurements as described in the above-mentioned references, since the verifying operation is not considered, the normal effect cannot be obtained if the width of a pulse to be applied is erroneously set. It is necessary to make the setting the pulse duration with a margin in order to avoid such a situation. Thus, there is a problem in that a total erasing operation time is elongated. Further, in the first conventional approach in which systematic measurements are taken, hot holes are injected in a memory cell having a threshold voltage higher than a convergence value of the threshold voltage. This causes a great problem on the reliability. Therefore, it must be ensured that the whole distribution of threshold voltages after an erasing operation is lower than the convergence value.

SUMMARY OF THE INVENTION

The present invention has, as an object, to provide a method for initializing an electrically erasable non-volatile semiconductor memory device and the semiconductor memory device for the same, wherein the injection of hot holes is suppressed so that the reliability of the product can be increased.

Another object of the present invention is to provide a method for initializing an electrically erasable non-volatile semiconductor memory device and the semiconductor memory device for the same, wherein the distribution of threshold voltages can be made narrow so that the semiconductor memory device having a low voltage operability can be provided.

In order to achieve an aspect of the present invention, an electrically erasable non-volatile semiconductor memory device, includes a memory cell array which is composed of a plurality of memory blocks, each memory block including memory cells arranged in column and row directions in a matrix manner. Each memory cell includes a source, a drain, a floating gate and a control gate. The semiconductor memory device further includes a row decoder section provided for each of the memory blocks, and connected to all the memory cells in each memory block through the control gates by a plurality of word lines in the row direction, for specifying the memory cell in the row direction, and a column decoder section provided for each of the memory blocks, and connected to all the memory cells in each memory block through the sources by a plurality of bit lines in the column direction, for specifying the memory cell in the column direction, an erasing circuit provided for each of the memory blocks, and connected to all the memory cells in the each memory block through the drains, a sense amplifier section for reading data from the memory block in units of bit lines, and a programming circuit for programming data in each memory cell of each memory block. The semiconductor memory device further includes a control circuit for controlling the row decoder means, the column decoder means, the erasing circuit, the sense amplifier means and the programming circuit to initialize the memory device. The control circuit executes:

(a) an erasing operation for each of the memory cell blocks until a threshold voltage of each memory cell of each memory block is equal to or lower than a first predetermined value which is lower than a second predetermined value as a final upper limit of a final distribution of threshold voltages of all the memory cells in the each memory block, (b) a programming back operation for each memory block until each memory cell has the threshold voltage equal to or higher than a third predetermined value as a final lower limit, and (c) a verifying operation for each memory block to ensure that all the memory cells of the each memory block have the threshold voltages lower than the upper limit.

In order to achieve another aspect of the present invention, a method of initializing an electrically erasable non-volatile semiconductor memory device including a memory cell array composed of a plurality of blocks, includes the steps of:

executing an erasing operation to each of the memory cell blocks such that a threshold voltage of each memory cell of the each memory block is equal to or lower than a first predetermined value which is lower than a second predetermined value as a final upper limit of a final distribution of threshold voltages of all the memory cells in the each memory block;

executing a programming back operation to the each memory block until each memory cell has the threshold voltage equal to or higher than a third predetermined value as a final lower limit.

For purpose of setting a narrow distribution of threshold voltages, the erasing operation may further include executing an erase verifying operation to the each memory cell to ensure that the each memory cell has the threshold voltage equal to or lower than the first predetermined value.

The method may further includes executing a verifying operation to the each memory block to ensure that all the memory cells of the each memory block have the threshold voltages lower than the upper limit. Thereby, the final distribution of threshold voltages can be ensured.

A pre-programming operation may be executed to each memory block until all the memory cells of the each memory block have the threshold voltages equal to or higher than a fourth predetermined value which is higher than the second predetermined value. Alternatively, a programming back verifying operation may be executed to each of columns of the each memory block to ensure that the memory cells of each column have the threshold voltages equal to or higher than the third predetermined. In this case, the final distribution of threshold voltages could be further narrowed.

In the programming back operation, a predetermined potential may be applied to one of the source and the drain of the each memory cell and a ground potential may be applied to the other. Alternatively, a predetermined potential may be applied to the control gate of each memory cell. In this case, the injection of hot holes could be suppressed.

DESCRIPTION OF THE PREFERRED EMBODIMENTS

An electrically erasable non-volatile semiconductor memory device and the initializing method according to the present invention will be described in detail with reference to the accompanying drawings.

Figure 3:
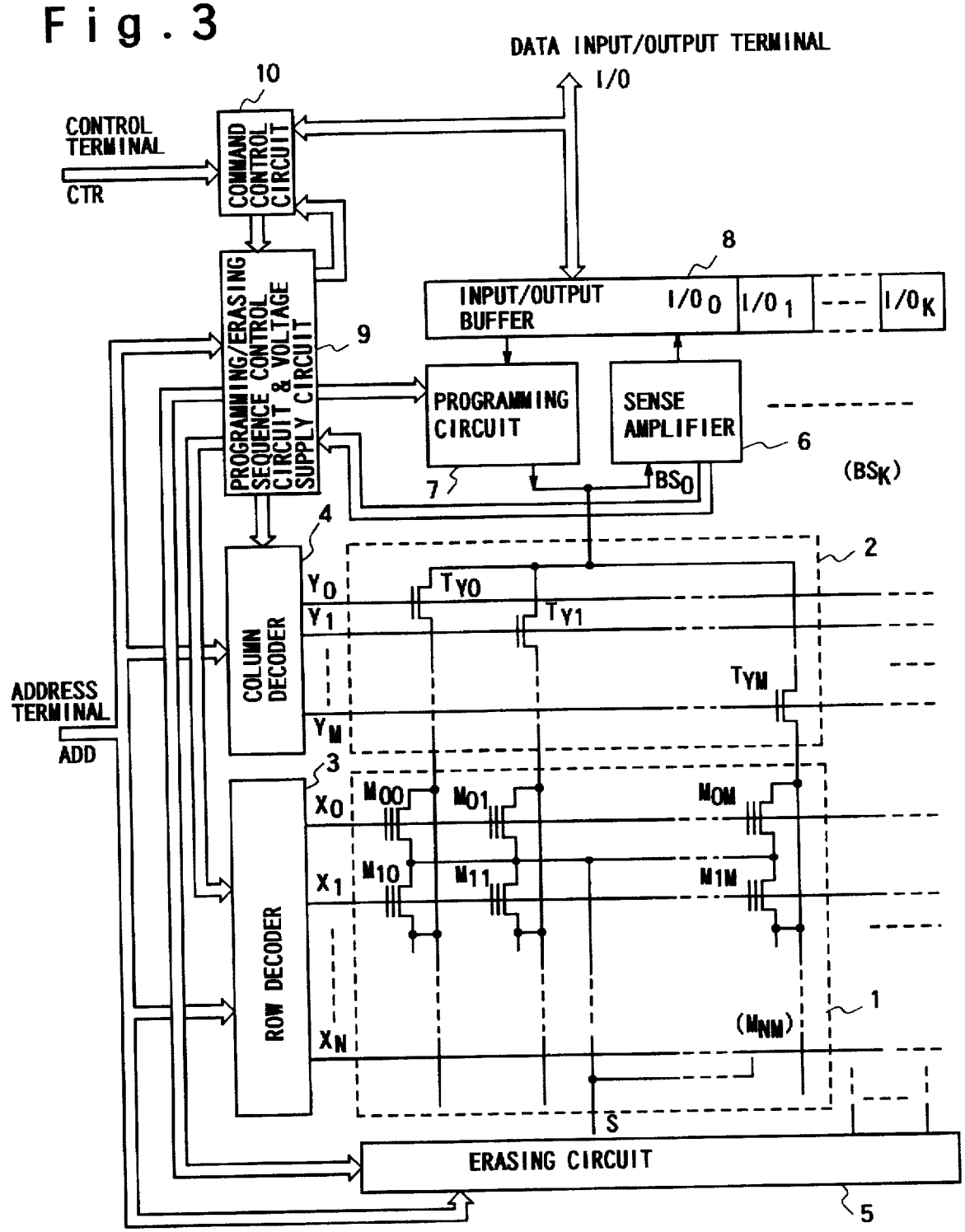
FIG. 3 is a block structural diagram of an electrically erasable non-volatile semiconductor memory device such as a flash memory according to a first embodiment of the present invention.

FIG. 3 is a block diagram of an electrically erasable non-volatile semiconductor memory device to which an initializing method according to the first embodiment of the present invention is applied. Referring to FIG. 3, the semiconductor memory device includes a plurality of memory blocks 1 of a memory cell array, each of which memory blocks includes memory cells $M_{00}$ to $M_{nm}$ arranged in a matrix manner in column and row directions, a row decoder 3 for decoding a part of an address inputted from an address terminal ADD to select one of word lines $X_0$ to $X_N$, a column decoder 4 for decoding a remained part of the address, and a group 2 of column selecting transistors $T_{Y0}$ to $T_{YM}$, for selecting one of the bit lines in accordance with the output from the column decoder 4. The semiconductor memory device further includes an erasing circuit 5 for supplying an erase voltage, a sense amplifier 6 for detecting data from a selected memory cell via the selected bit line, a programming circuit 7 for writing or programming data in a selected memory cell, an input/output buffer 8 connected to the programming circuit 7, the sense amplifier 6, and a data input/output terminal I/O, for sending data to the programming circuit 7 and receiving data from the sense amplifier 6, a command control circuit 10 connected to a control terminal CTR, the data input/output terminal I/O, the input/output buffer 8 and a circuit 9, for receiving a command externally from the control terminal CTR or data input/output terminal I/O or internally from the input/output buffer 8 or circuit 9 to issue another command to the circuit 9. The circuit 9 is a programming/erasing sequence control circuit & voltage supply circuit 9 and controls the above-mentioned various sections to execute an initializing operation, a programming operation and a read operation.

The transistor of each of the memory cells has a control gate, a floating gate, a source and a drain. The control gate is commonly connected to one of the word lines $X_0$ to $X_n$ in the row direction and the drain is commonly connected in the column direction to one of the bit lines which are connected to the transistors $T_{Y0}$ to $T_{YM}$ of the column selecting transistor group 2. In the transistor group 2, one of the bit lines is selected by column selecting transistors $T_{Y0}$ to $T_{Ym}$. The source of each memory cell transistor is commonly connected in one memory block to the erasing circuit 5.

Further, an input/output bus line $BS_k$ is provided between each of the column selecting transistor groups 2 and the programming circuit 7 and sense amplifier 6 and a data read out from a memory cell is outputted to the data input/output terminal I/O through the input/output buffer 8. On the other hand, a programmed data is inputted from the data input/output terminal I/O through the input/output buffer 8 and an adequate write voltage is applied to the drain of a selected memory cell through the column selecting transistor group 2 by a programming circuit 7.

In order to perform the entire initializing operation, the programming/erasing sequence control circuit & voltage supply circuit 9 supplies various signals and voltages to the respective circuits in the semiconductor memory device. In the memory device, an operation command is received externally from the control terminal CTR or data input/output terminal I/O or internally from the input/output buffer 8 or circuit 9. Therefore, the command control circuit 10 issues a command to the programming/erasing sequence circuit 9 which controls the various sections of the semiconductor memory device by issuing signals and commands to execute the initializing operation.

Figure 4:
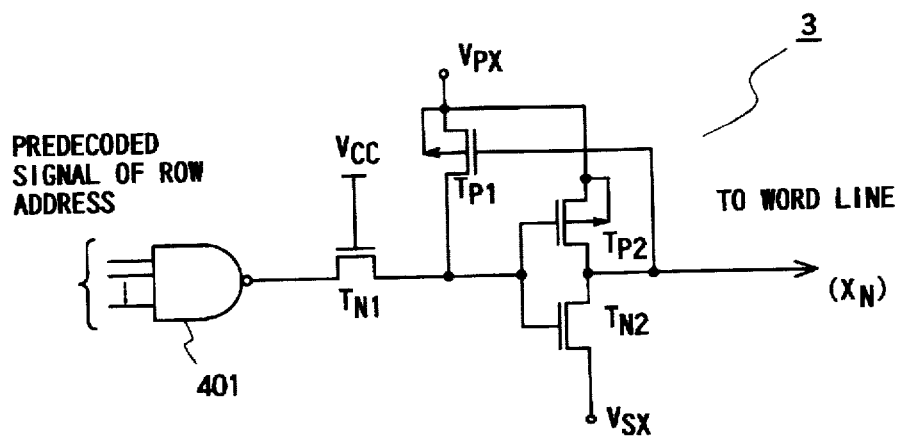
FIG. 4 is a circuit diagram showing a row decoder of the semiconductor memory device shown in FIG. 3.
Figure 5:
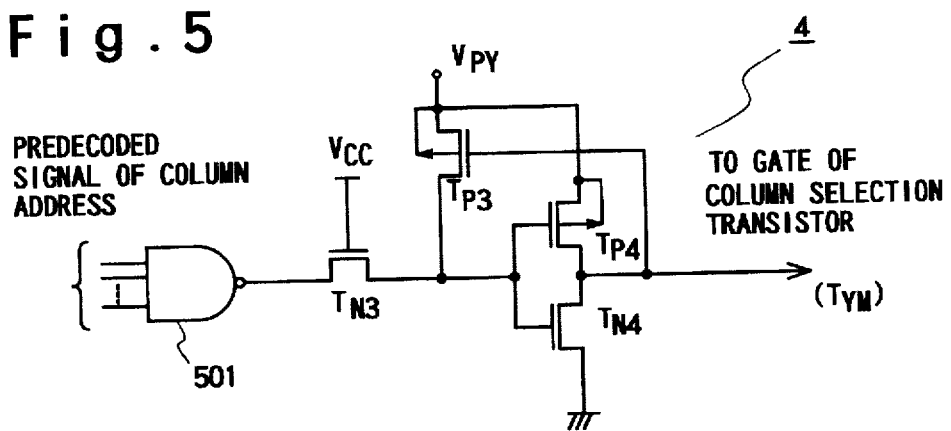
FIG. 5 is a circuit diagram showing a column decoder of the semiconductor memory device shown in FIG. 3.
Figure 6:
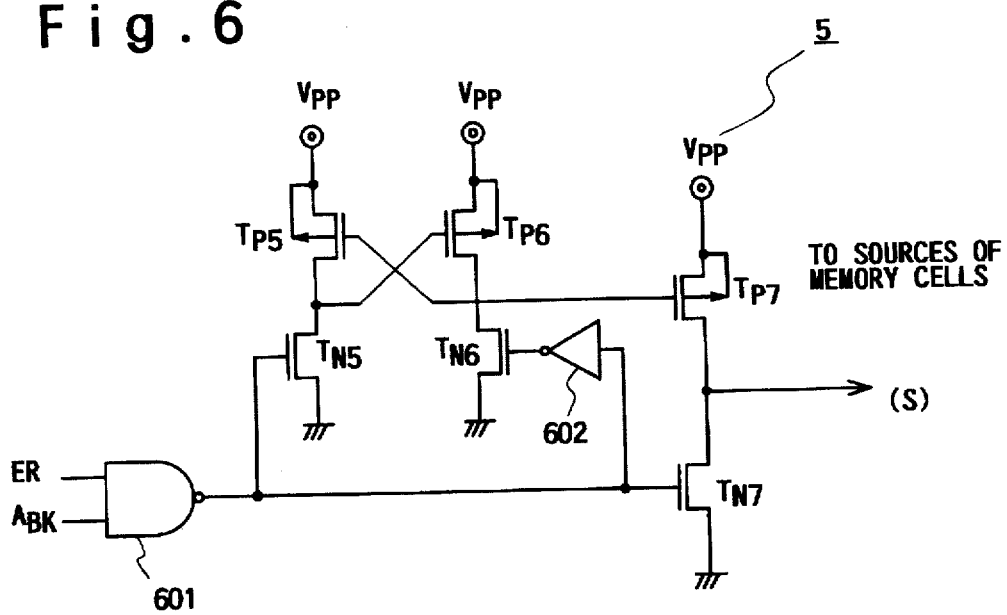
FIG. 6 is a circuit diagram of an erasing circuit of the semiconductor memory device shown in FIG. 3.
Figure 7:
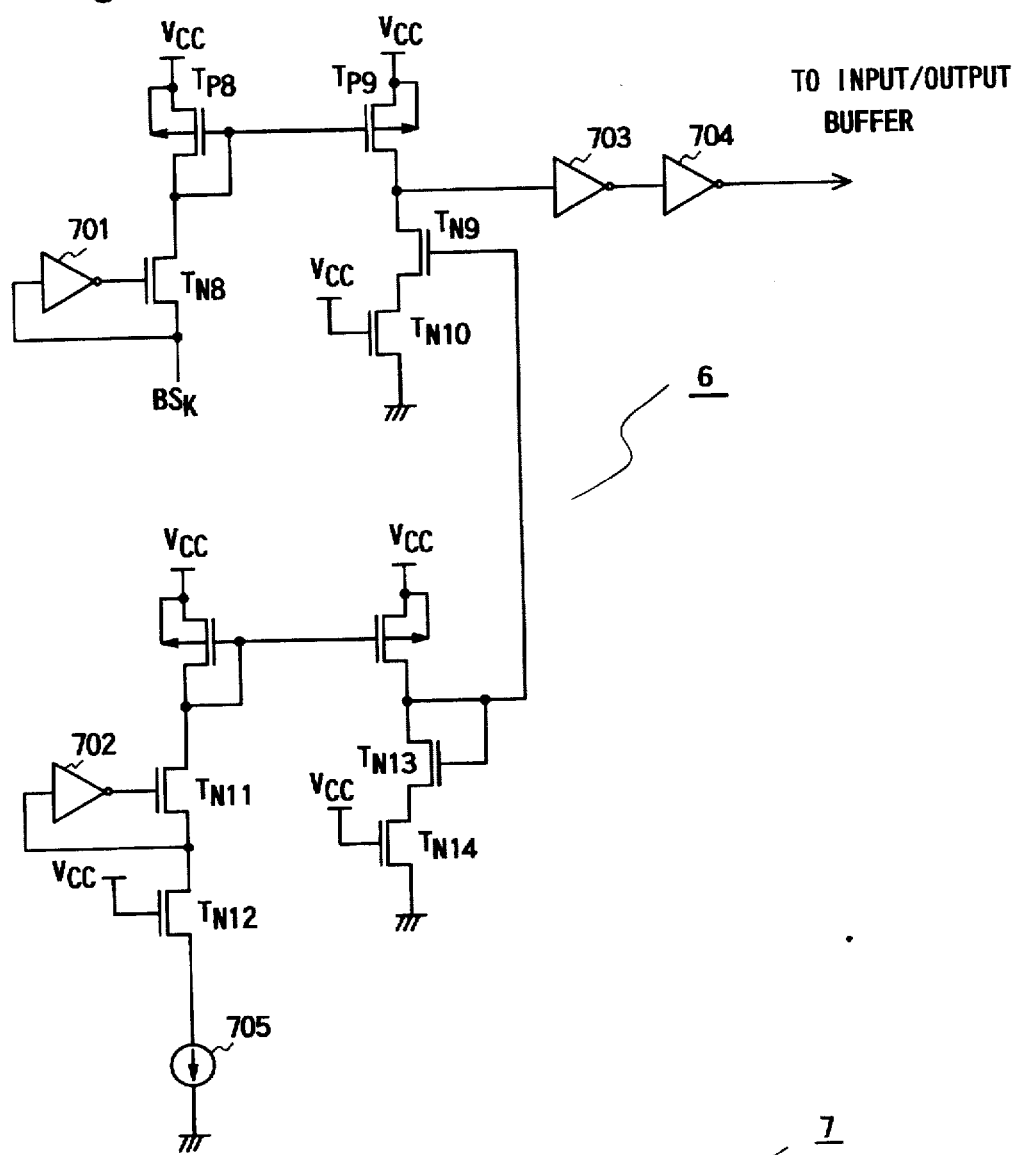
FIG. 7 is a circuit diagram showing a sense amplifier of the semiconductor memory device shown in FIG. 3.
Figure 8:
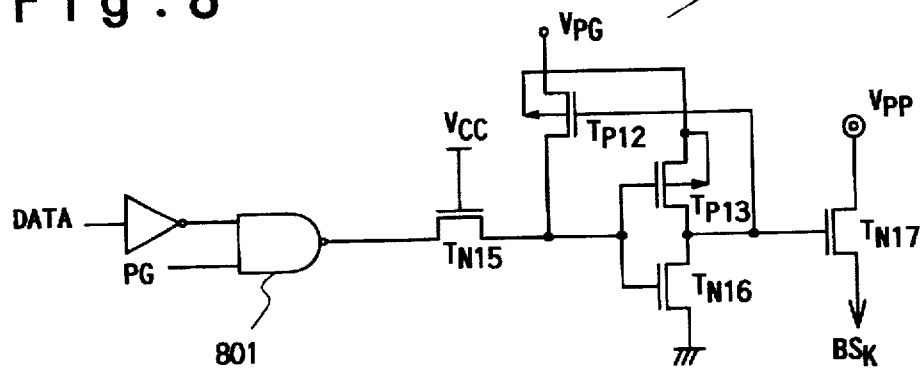
FIG. 8 is a circuit diagram showing a programming circuit of the semiconductor memory device shown in FIG. 3.

FIGS. 4 to 8 show examples of the row decoder 3, column decoder 4, erasing circuit 5, sense amplifier 6, and programming circuit 7. These circuits are well known to a person skilled in the art and the detailed description will be omitted. In FIG. 4, the row decoder 3 decodes a pre-decoded signal of a row address and supplies a row power supply voltage $V_{PX}$ or a voltage $V_{SX}$ for checking a threshold voltage lower limit $V_{DV}$ of about 0.5V to a row of control gates in accordance with the decoded result. In the initializing operation, a transistor $T_{N2}$ is set in the conductive state over the all the word lines by controlling a NAND circuit 401, so that the voltage $V_{SX}$ is applied to all the word lines. In FIG. 5, the column decoder 5 decodes a pre-decoded signal of a column address and supplies the column power supply voltage $V_{PY}$ to the gate of one of the column selecting transistors in accordance with the decoded result. In FIG. 6, the erasing circuit 5 to which a power supply voltage $V_{PP}$ is supplied receives an erase operation control signal ER and a memory block selection signal $A_{BK}$ from the control circuit 9 and supplies a positive high voltage to the sources of all the memory cells in the memory block 1. In FIG. 7, the sense amplifier 6 receives the signal $BS_K$ to output it to the input/output buffer 8. A variable constant current source is changed in current value in correspondence to an over-erase verifying operation, a threshold voltage lower limit verifying operation (the lower limit $V_{DV}$ is about 0.5V) and a threshold voltage upper limit verifying operation (the upper limit $V_{EV}$ is about 3V). In FIG. 8, the programming circuit 7 receives a data signal DATA from the input/output buffer and a write control signal PG from the control circuit 9 to supply the data signal as the signal $BS_K$. Thus, each of the circuits receives the signal/voltage supplied from the programming/erasing sequence control circuit & voltage supply circuit 9 to execute a predetermined operation.

Next, the initializing method according to the first embodiment of the present invention will be described below with reference to FIG. 9.

Figure 1:
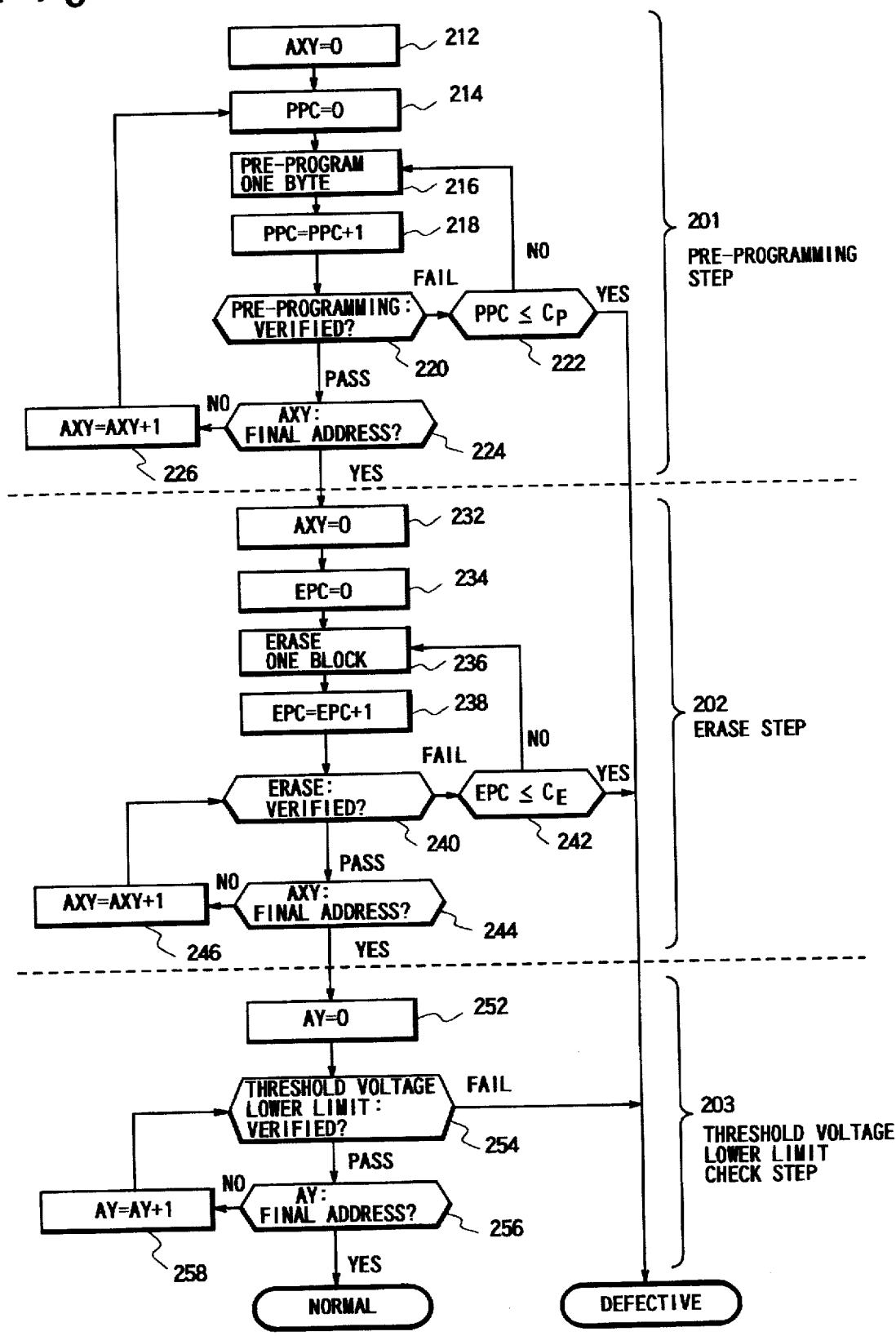
FIG. 1 is a flow chart showing a conventional initializing operation in a flash memory.
Figures 2A, 2B:
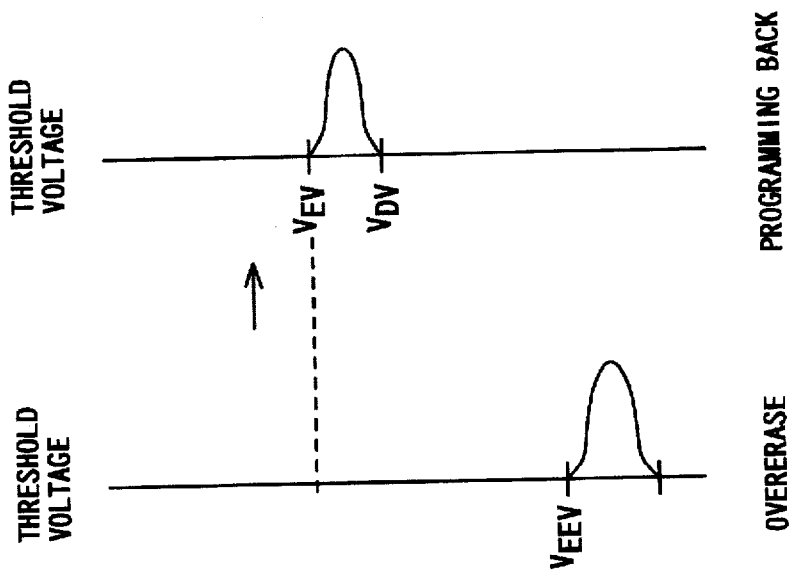
FIGS. 2A and 2B are diagrams showing a distribution of memory cell threshold voltages when a pre-programming operation is executed and when an erasing operation is executed, respectively.
Figures 10A, 10B:
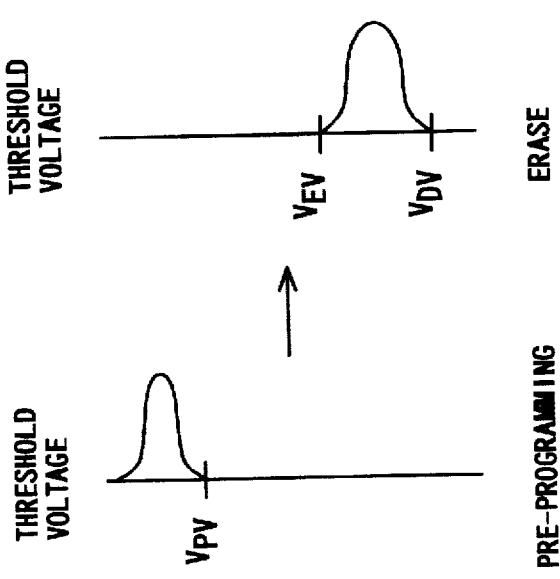
FIGS. 10A and 10B are diagrams showing the distribution of memory cell threshold voltages when an over-erasing operation is executed and when a re-programming operation is executed.
Figure 9:
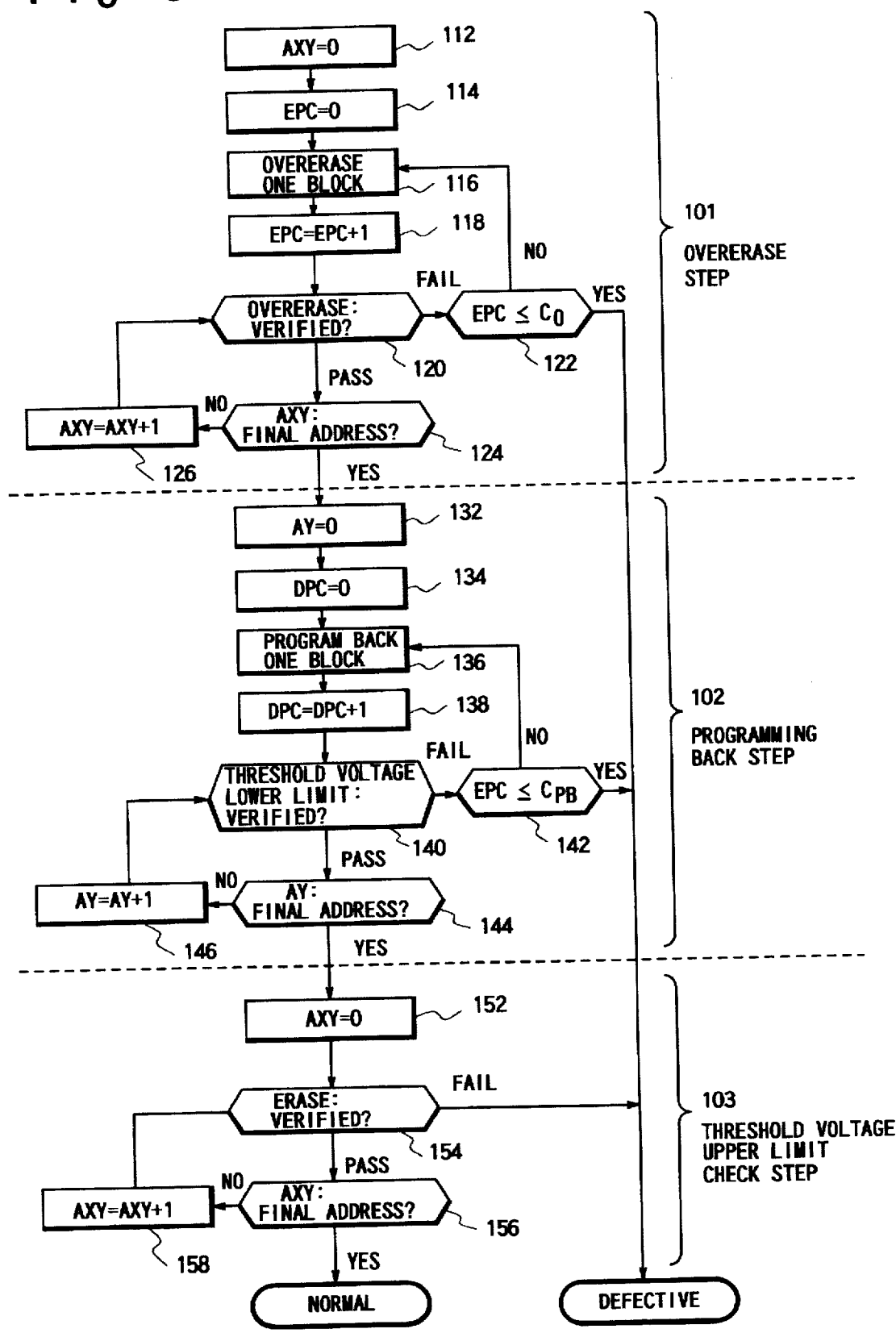
FIG. 9 is a flow diagram showing an initializing method of the electrically erasable non-volatile semiconductor memory device according to the first embodiment of the present invention.

First, referring to FIG. 9, an address counter AXY and counter EPC are set to "0" in steps 112 and 114. In a step 116, an over-erasing operation is executed in units of memory blocks while an erase verifying operation is executed (step 101). At this time, in the over-erasing operation, a high voltage pulse is repeatedly applied to each memory cell designated by the address counter AXY in steps 118 to 122 to reduce the upper limit of the distribution of threshold voltages of the memory cells to a voltage $V_{EEV}$ lower than a final target voltage, i.e., the threshold voltage upper limit $V_{EV}$ of about 3V. In the over-erasing operation, the high voltage is supplied from the erasing circuit 5 to the sources of all the memory cell transistors in response to the control circuit 9. The control gate and drain of each memory cell transistor are respectively grounded and opened by the row decoder 3 and column decoder 4 in accordance with the control circuit 9. The high voltage pulse has a relatively long duration time compared to that in the conventional device. In this case, if it is determined in the step 122 that the number of cycles is over a value $C_0$, the device is determined to be defective. It is determined in the step 120 whether the threshold voltage is equal to or lower than the voltage $V_{EEV}$. The current source 705 (see FIG. 7) of the sense amplifier 6 is controlled by the control circuit 9 to execute the verifying operation. The result is informed to the control circuit 9. If it is determined in the step 120 that the threshold voltage is equal to or lower than the voltage $V_{EEV}$, whether the address counter AXY indicates a final memory cell address is determined in a step 124. If not the final memory cell address, the address counter AXY is incremented by "1" to execute the verifying operation to the next memory cell. In the final memory cell address, the over-erasing operation is completed. The distribution of threshold voltages after the over-erasure is shown in FIG. 10A.

Next, the programming-back operation is executed in units of memory blocks while a verifying operation is executed (step 102). In the programming-back operation, an address counter AY and a counter DC are set to "0" in step 132 and 134. The programming-back operation is executed in a step 136. In the programming-back operation, a high voltage is applied to the drains of memory cells and the sources are connected to the ground potential by the erasing circuit 5, column decoder 4 and programming circuit 7 in response to the control circuit 9 in this embodiment. In this case, the high voltage pulse having a relative long duration is repeatedly applied. However, the high voltage and the ground potential may be applied to the sources and the drains inversely. Also a high voltage may be supplied to the control gates of all the memory cell transistors by the row decoder 3 in response to the control circuit 9. Alternatively, in the programming-back operation, a high voltage may be applied to the control gate. In a case where the high voltage is applied to the control gates, all the word line $X_0$ to $X_n$ are selected and set in a high potential state by controlling the row decoder 3. The sources and drains may be set to a voltage close to about 0V. Next, the counter DC is incremented by "1" in a step 138. In a step 140, whether the threshold voltage is equal to or higher than a final target voltage, i.e., the threshold voltage lower limit $V_{DV}$ of about 0.5V is checked. If not, the programming-back operation is repeated in the step 136. When it is determined in a step 142 that the counter DC is over a value $C_P$, the memory device is determined to be defective. A verifying operation is executed in the step 140. At this time, the sense amplifier 6, the erasing circuit 5 and the row decoder 3 are controlled by the control circuit 9 such that the source is grounded, a predetermined voltage is applied to the control gate and the sense amplifier detects the data read out from the memory cells. If the verifying operation is passed in the step 140, whether the address counter AY indicates the final column address is checked in a step 144. If not, the address counter AY is incremented by "1", the verifying operation is executed to the next column in the step 140. This is because the memory cells are connected to one bit line in the column direction. If the final column address is in the step 144, the programming-back operation is completed. As a result, the distribution of threshold voltages is obtained as shown in FIG. 10B. However, in the case, the upper limit is not yet checked.

Finally, a threshold voltage upper limit checking operation is executed in a step 103. In the checking step, an address counter AXY is set to "0" in a step 152. In a step 154, a verifying operation is executed to ensure that the threshold voltage of each memory cell is equal to or lower than a final target value of $V_{EV}$. The verifying operation is executed in the same manner as described above by changing the reference voltage. If not in the step 154, the memory device is determined to be defective. When the step 154 is passed, whether the address counter AXY indicates the final memory address is checked in a step 156. If not, a step 158 is executed to increment the address counter AXY by "1" and then the verifying operation is executed to the next memory cell. If yes in the step 156, the initializing operation is completed. At this time, the upper limit of the distribution of threshold voltages is ensured.

The reason why the over-erasing operation is executed in the step 101 is due to the following notable matters.

First, the erasing operation is difficult to be executed because of the memory cell characteristics when the threshold voltage has become negative so that an electric field becomes small. This means that the lower limit of the threshold voltages saturates with a negative value, so that the distribution of threshold voltages can be narrowed or converged.

Second, in the programming-back operation in which a high voltage is applied to one of the sources and drains while the other is connected to the ground potential, there is a problem of reliability in the injection of hot holes as described above. Therefore, the over-erasure is required in order to ensure that only electrons are injected without injection of holes.

Third, in the programming-back operation in which a high voltage is applied to the control gates, since there is not a self convergence effect although the distribution is narrowed, the memory device cannot operate normally unless the programming-back operation is not executed after the over-erase operation is executed.

Figure 11:
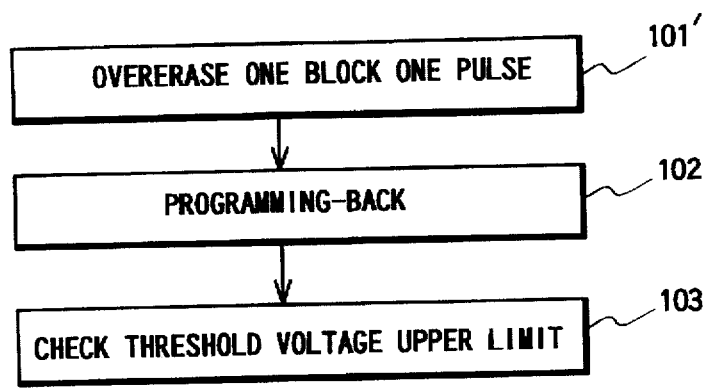
FIG. 11 is a flow chart of a modified initializing method according to the first embodiment of the present invention.

From the first standpoint, the over-erasure does not affect so much because of the verifying operation. If it is ensured that the distribution of threshold voltages is narrowed through the programming-back operation, the threshold voltage upper limit checking step 103 may be omitted. Further, if the distribution of threshold voltages is converged in the over-erasing operation, the verifying operation may be omitted from the step 101 so that only the over-erasing operation 101' is executed as shown in FIG. 11.

Figure 12:
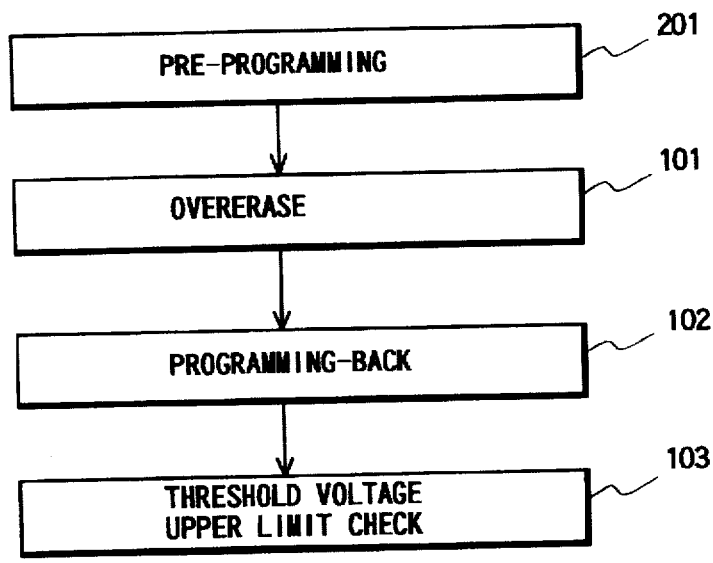
FIG. 12 is a flow chart showing an initializing method of the electrically erasable non-volatile semiconductor memory device according to a second embodiment of the present invention.

Next, another method of initializing according to the second embodiment of the present invention will be described with reference to FIG. 12. Referring to FIG. 12, the initializing method in the second embodiment is the same as the initializing method of the first embodiment except that a pre-programming step which is the same as the pre-programming operation 201 in the conventional initializing method is added before the over-erasure routine 101 to the initializing method flow of the first embodiment. Therefore, the detail of pre-programming operation will not be described. Thereby, the distribution of threshold voltages can be further narrowed. The narrower the distribution of threshold voltages is before the erasing operation, the narrower the resultant distribution of threshold voltage after the initializing operation is. Further, since it is not necessary to execute the over-erasure to too much extent, total erasing operation time is not increased.

As described above, the present invention relates to an initializing method of an electrically erasable non-volatile semiconductor memory device such as a flash memory. Since the present invention employs a method in which the programming-back operation is executed to a memory block as well as a verifying operation until the memory cell threshold voltage lower limit becomes equal to or higher than a predetermined voltage, after the over-erasing operation is executed once, the distribution of threshold voltages can be narrowed to about ½ to ¾ compared to the conventional initializing method as well as an abnormal operation caused by omitting the verifying operation and the increase of erasing operation time can be prevented.

As described above, a method of initializing the electrically erasable non-volatile semiconductor memory device according to the present invention includes a step of repeating an over-erasing operation and verifying operation until an upper limit of the threshold voltages of the memory cells is equal to or lower than a predetermined voltage $V_{EEV}$, a step of repeating the programming-back operation in which a high voltage is applied to the control gates of the memory cells or a high voltage is applied to one of the sources and drains of the memory cells while the other is connected to the ground potential, until a lower limit of the threshold voltages of the memory cells is equal to or higher than a second predetermined voltage ($V_{DV}$), a final routine of verifying that an upper limit of the threshold voltages of the memory is equal to or lower than a third predetermined voltage $V_{EV}$, thereby the distribution of threshold voltages falls within a range equal to or higher than the second predetermined voltage $V_{DV}$ and equal to or lower than the third predetermined voltage $V_{EV}$. As a result, the distribution of threshold voltages can be narrowed without damage to the reliability, and without increase of the erasing operation time and an abnormal operation caused by executing the erasing operation and the programming-back operation using a predetermined pulse with no verifying operation.

What is claimed is:

1. A method of initializing an electrically erasable non-volatile semiconductor memory device including a memory cell array composed of a plurality of memory blocks, comprising the steps of:

(a) executing, on a memory block-by-memory block basis, an erasing operation to each of the memory blocks until a threshold voltage of each memory cell of said each memory block is equal to or lower than a first predetermined value as a final lower limit of a final distribution of threshold voltages of all the memory cells in said each memory block, said final distribution of threshold voltages of all the memory cells in said each memory block having a second predetermined value as a final upper limit which is higher than said first predetermined value; and (b) after said step (a), executing a programming back operation to said each memory block until each memory cell has the threshold voltage equal to or higher than said first predetermined value and equal to or lower than said second predetermined value.

2. A method according to claim 1, further comprising the step of:

after said step (a) and before said step (b), executing a verifying operation, on a memory block-by-memory block basis, to said each memory block to ensure that all the memory cells of said each memory block have the threshold voltages equal to or lower than said first predetermined value.

3. A method according to claim 2, further comprising the step of:

executing, before said step (a) is executed, a pre-programming operation to said each memory block, on a memory block-by-memory block basis, until all the memory cells of said each memory block have threshold voltages equal to or higher than threshold voltages before said step (a) is executed.

4. A method according to claim 1, further comprising the step of:

executing, before said step (a) is executed, a pre-programming operation to said each memory block, on a memory block-by-memory block basis, until all the memory cells of said each memory block have threshold voltages equal to or higher than threshold voltages before said step (a) is executed.

5. A method according to claim 1, wherein said step of executing an erasing operation includes executing an erase verifying operation to said each memory cell to ensure that said each memory cell has the threshold voltage equal to or lower than said first predetermined value.

6. A method according to claim 1, wherein said step of executing a programming back operation includes executing a programming back verifying operation to each of columns of said each memory block to ensure that said memory cells of said each column have the threshold voltages equal to or higher than said first predetermined value and equal to or lower than said second predetermined value.

7. A method according to claim 1, wherein said each memory cell has a transistor having a source, a drain, a floating gate and a control gate, and wherein said step of executing a programming back operation includes applying a predetermined potential to one of said source and said drain of said each memory cell and a ground potential to the other.

8. A method according to claim 1, wherein said each memory cell has a transistor having a source, a drain, a floating gate and a control gate, and wherein said step of executing programming back operation includes applying a predetermined potential to said control gate of said each memory cell.

9. A method according to claim 1, wherein after the erasing operation is performed for one of the memory blocks, a verifying operation is performed for said one of the memory blocks, wherein the erasing operation for any other of the memory blocks is not performed until the verifying operation for the one of the memory blocks outputs a result that all memory cells of the one of the memory blocks have corresponding threshold voltages less than the first predetermined value, and wherein, during the programming back operation, a voltage greater than a third predetermined value is applied to drains of transistors of each memory block, said third predetermined value being greater than said first predetermined value.

10. An electrically erasable non-volatile semiconductor memory device, comprising:

a memory cell array which is composed of a plurality of memory blocks, each memory block including memory cells arranged in column and row directions in a matrix manner, wherein each memory cell includes a transistor having a source, a drain, a floating gate and a control gate;

row decoder means provided for each of said memory blocks, and connected to all the memory cells in said each memory block through the control gates by a plurality of word lines in a row direction, for specifying the memory cell in the row direction;

column decoder means provided for each of said memory blocks, and connected to all the memory cells in said each memory block through the sources by a plurality of bit lines in a column direction, for specifying the memory cell in the column direction;

an erasing circuit provided for each of said memory blocks, and connected to all the memory cells in said each memory block through the drains;

sense amplifier means for reading data from said each memory block in units of bit lines;

a programming circuit for programming data in said each memory cell of said each memory block; and a control circuit for controlling to said row decoder means, said column decoder means, said erasing circuit, said sense amplifier means and said programming circuit to initialize said memory device, wherein said control circuit executes:

(a) an erasing operation, on a memory block-by-memory block basis, to each of the memory blocks until a threshold voltage of each memory cell of said each memory block is equal to or lower than a first predetermined value as a final lower limit of a final distribution of threshold voltages of all the memory cells in said each memory block, said final distribution of threshold voltages of all the memory cells in said each memory block having a second predetermined value as a final upper limit which is higher than said first predetermined value;

(b) after the erasing operation, a programming back operation to said each memory block until each memory cell has a threshold voltage equal to or higher than said first predetermined value and equal to or lower than said second predetermined value; and (c) after the programming back operation, a verifying operation, on a memory block-by-memory block basis, to said each memory block to ensure that all the memory cells of said each memory block have threshold voltages equal to or lower than said second predetermined value and equal to or higher than said first predetermined value.

11. A semiconductor memory device according to claim 10, wherein said control circuit controls said programming circuit such that a predetermined potential is applied to the source of said each memory cell, wherein the drain of said each memory cell is connected to the ground potential.

12. A semiconductor memory device according to claim 10, wherein said control circuit controls said row decoder means such that a predetermined potential is applied to said control gate of said each memory cell in the programming back operation.

13. A method according to claim 10, wherein after the erasing operation is performed for one of the memory blocks, a verifying operation is performed for said one of the memory blocks, wherein the erasing operation for any other of the memory blocks is not performed until the verifying operation for the one of the memory blocks outputs a result that all memory cells of the one of the memory blocks have corresponding threshold voltages less than the first predetermined value, and wherein, during the programming back operation, a voltage greater than a third predetermined value is applied to the drains of the transistors of each memory block, said third predetermined value being greater than said first predetermined value.

14. A method of initializing an electrically erasable non-volatile semiconductor memory device including a memory cell array composed of a plurality of memory blocks, comprising the steps of:

executing an erasing operation, on a memory block-by-memory block basis, to each of the memory blocks without executing any verifying operation for any other of the memory blocks, such that a threshold voltage of each memory cell of said each memory block is equal to or lower than a first predetermined value which is lower than a second predetermined value, a final distribution of threshold voltages of all the memory cells in said each memory block having said first and second predetermined values as a final lower and upper limit, respectively;

after said erasing operation, executing a programming back operation to said each memory block until each memory cell has a threshold voltage equal to or higher than said first predetermined value and equal to or lower than said second predetermined value.

15. A method according to claim 14, further comprising the step of:

after the programming back operation, executing a verifying operation to said each memory block to ensure that all the memory cells of said each memory block have threshold voltages lower than said second predetermined value.

16. A method according to claim 15, further comprising the step of:
   before the erasing operation, executing a pre-programming operation, on a memory block-by-memory block basis, to said each memory block until all the memory cells of said each memory block have threshold voltages equal to or higher than threshold voltages before the erasing operation.

17. A method according to claim 14, further comprising the step of:
   before the erasing operation, executing a pre-programming operation, on a memory block-by-memory block basis, to said each memory block until all the memory cells of said each memory block have threshold voltages equal to or higher than threshold voltages before the erasing operation.

18. A method according to claim 14, wherein said each memory cell has a transistor having a source, a drain, a floating gate and a control gate, and wherein said step of executing a programming back operation includes applying a predetermined potential to one of said source and said drain of said each memory cell and a ground potential to the other.

19. A method according to claim 14, wherein said each memory cell has a transistor having a source, a drain, a floating gate and a control gate, and wherein said step of executing a programming back operation includes applying a predetermined potential to said control gate of said each memory cell in a state.

20. A method according to claim 14, wherein after the erasing operation is performed for one of the memory blocks, a verifying operation is performed for said one of the memory blocks, wherein the erasing operation for any other of the memory blocks is not performed until the verifying operation for the one of the memory blocks outputs a result that all memory cells of the one of the memory blocks have corresponding threshold voltages less than the first predetermined value, and wherein, during the programming back operation, a voltage greater than a third predetermined value is applied to drains of transistors of each memory block, said third predetermined value being greater than said first predetermined value.

* * * * *